(12) United States Patent
Liu et al.

(10) Patent No.: US 10,847,188 B1
(45) Date of Patent: Nov. 24, 2020

(54) ACCOMMODATING STRUCTURE OF DATA STORAGE UNIT AND ACCOMMODATING ASSEMBLY THEREOF MOUNTED ON SERVER

(71) Applicant: Super Micro Computer Inc., San Jose, CA (US)

(72) Inventors: Yueh-Ming Liu, New Taipei (TW); Hung-Chieh Chang, New Taipei (TW); Tan-Hsin Chang, New Taipei (TW); Hsiao-Chung Chen, San Jose, CA (US); Yu-Chuan Chang, New Taipei (TW)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/591,602

(22) Filed: Oct. 2, 2019

(51) Int. Cl.
| | | |
|---|---|---|
| *H05K 5/02* | (2006.01) | |
| *G11B 33/02* | (2006.01) | |
| *H05K 7/14* | (2006.01) | |
| *H05K 5/00* | (2006.01) | |

(52) U.S. Cl.
CPC ......... *G11B 33/027* (2013.01); *H05K 5/0026* (2013.01); *H05K 5/0256* (2013.01); *H05K 7/1487* (2013.01); *H05K 7/1489* (2013.01)

(58) Field of Classification Search
CPC ........................................................ H05K 5/00
See application file for complete search history.

(56) References Cited

U.S. PATENT DOCUMENTS

| | | | | |
|---|---|---|---|---|
| 2009/0296338 A1* | 12/2009 | Peng | .................. | G06F 1/187 |
| | | | | 361/679.31 |
| 2018/0182437 A1* | 6/2018 | Chang | .................. | G11B 33/128 |
| 2019/0141851 A1* | 5/2019 | Chen | .................. | H01R 12/79 |

* cited by examiner

*Primary Examiner* — Jerry Wu
(74) *Attorney, Agent, or Firm* — Chun-Ming Shih; HDLS IPR Services (57) ABSTRACT

An accommodating structure of data storage unit includes a carrier case formed by integrated injection molding. The carrier case is a plastic piece comprising a housing, a pair of elastic arms connected with the housing and a push block connected with the elastic arms. The housing has a receiving space, and the push block has a tab at a side away from the receiving space. Moreover, the present invention further provides an accommodating assembly of data storage unit. The components of the accommodating assembly are less and the structures are simple to enhance the convenience of assembly.

16 Claims, 14 Drawing Sheets

ACCOMMODATING STRUCTURE OF DATA STORAGE UNIT AND ACCOMMODATING ASSEMBLY THEREOF MOUNTED ON SERVER

BACKGROUND OF THE INVENTION

Field of the Invention

The present invention generally relates to a data storage device, and in particular to a data storage device mounted on a server.

Description of Prior Art

For the demands of accessing a large amount of electronic data, cabinets of the server system usually provide a plurality of insertion spaces to accommodate the storage devices arranged in an array. Moreover, common storage devices comprise hard disk drives (HDD) or solid state disks (SSD) etc., and sizes of storage devices usually include 2.5 inch and 3.5 inch.

However, most of current storage devices can only install one size of storage devices. If different sizes of storage devices need to be installed, the size of the tray for carrying the storage devices must be replaced, thereby it causes inconvenience of use. Furthermore, the components of current storage devices are a lot and the structures are complicated, and they are often combined by riveting, so that current storage devices usually have disadvantages such as difficulty in assembly and high cost etc.

In view of the above drawbacks, the Inventor proposes the present invention based on his expert knowledge and elaborate researches in order to solve the problems of prior art.

SUMMARY OF THE INVENTION

Accordingly, an object of the present invention is to provide an accommodating structure of data storage unit, wherein the carrier case is a plastic piece formed by integrated injection molding for combining a data storage unit.

In order to achieve the object mentioned above, the present invention provides an accommodating structure of data storage unit for combining a data storage unit, comprising a carrier case formed by integrated injection molding. The carrier case is a plastic piece comprising a housing, a pair of elastic arms connected with the housing and a push block located between the pair of elastic arms. The housing is formed with a receiving space for accommodating the data storage unit, and the push block has a tab at a side away from the receiving space.

Accordingly, another object of the present invention is to provide an accommodating assembly of the data storage unit, wherein the carrier case is a plastic piece formed by integrated injection molding for combining a data storage unit; thus, screws are not required for the combination of the carrier case and the tray. In addition, the components of the accommodating assembly are less and the structures are simple to enhance the convenience of assembly.

In order to achieve the object mentioned above, the present invention provides an accommodating assembly of data storage unit for combining at least one data storage unit comprising a tray, a circuit board module and at least one carrier case. The tray includes a bottom plate and a plurality of supporting plates vertically extended from the bottom plate. The bottom plate and the supporting plates are enclosed to form a carrying space, and the supporting plates have a plurality of positioning slots. The circuit board module is disposed in the carrying space. The circuit board module includes a circuit board, a pair of adapter slots and an insertion slot electrically connected with the circuit board. The at least one carrier case is removably disposed in the carrying space. The carrier case is a plastic piece comprising a housing, a pair of elastic arms connected with the housing and a push block located between the pair of elastic arms. The housing is formed with a receiving space for accommodating the data storage unit, and the push block has a tab at a side away from the accommodating space. The carrier case is fixed on the tray through the tab being latched by the positioning slot, wherein the pair of elastic arms will be pulled by the push block under an external force, so that the tab will be disengaged from the positioning slot, thus the carrier case can be detached from the tray.

Accordingly, a further object of the present invention is to provide an accommodating assembly of data storage unit mounted on server, wherein the accommodating assembly is combined in the cabinet for accommodating data storage units as a server.

In order to achieve the object mentioned above, the present invention provides an accommodating assembly of data storage unit mounted on a server for combining at least one data storage unit comprising an accommodating assembly of data storage unit and a cabinet, and the accommodating assembly is combined in the cabinet.

Comparing to the prior art, the accommodating structure of data storage unit for combining a data storage unit is a plastic piece formed by integrated injection molding. The carrier case has a pair of elastic arms and a push block located between the pair of elastic arms. Besides, the push block has a tab, and the tray has positioning slots corresponding to the tab. Thereby, when the carrier case is assembled into the tray, the carrier case is fixed on the tray through the tab being latched by the positioning slot without using screws for combination. In addition, the pair of elastic arms will be pulled by the push block under an external force, so that the tab will be disengaged from the positioning slot, thus the carrier case can be rotated and detached from the tray to enhance the convenience of assembly.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
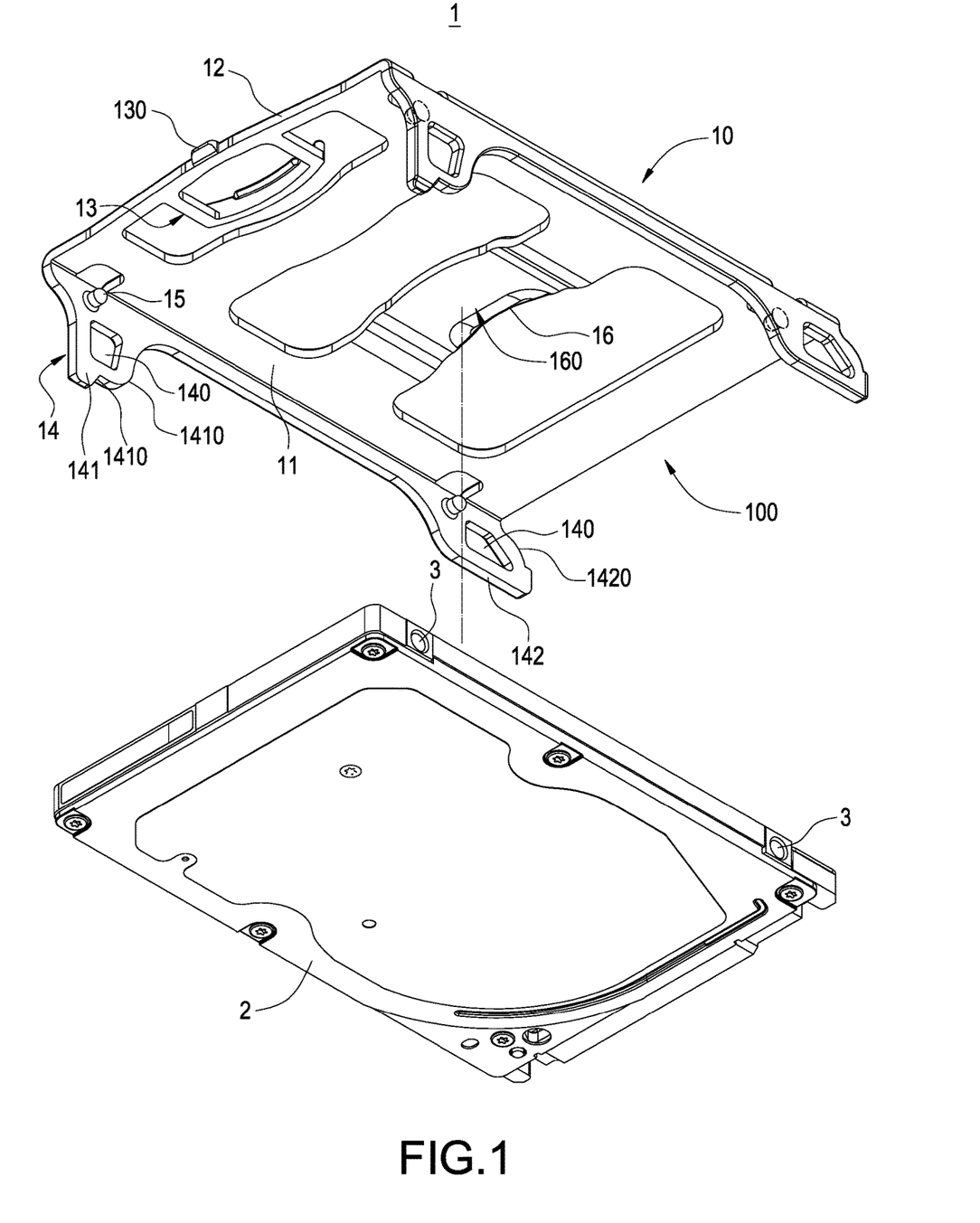
FIG. 1 is a perspective assembly schematic view of data storage unit and accommodating structure of the present invention.
Figure 2:
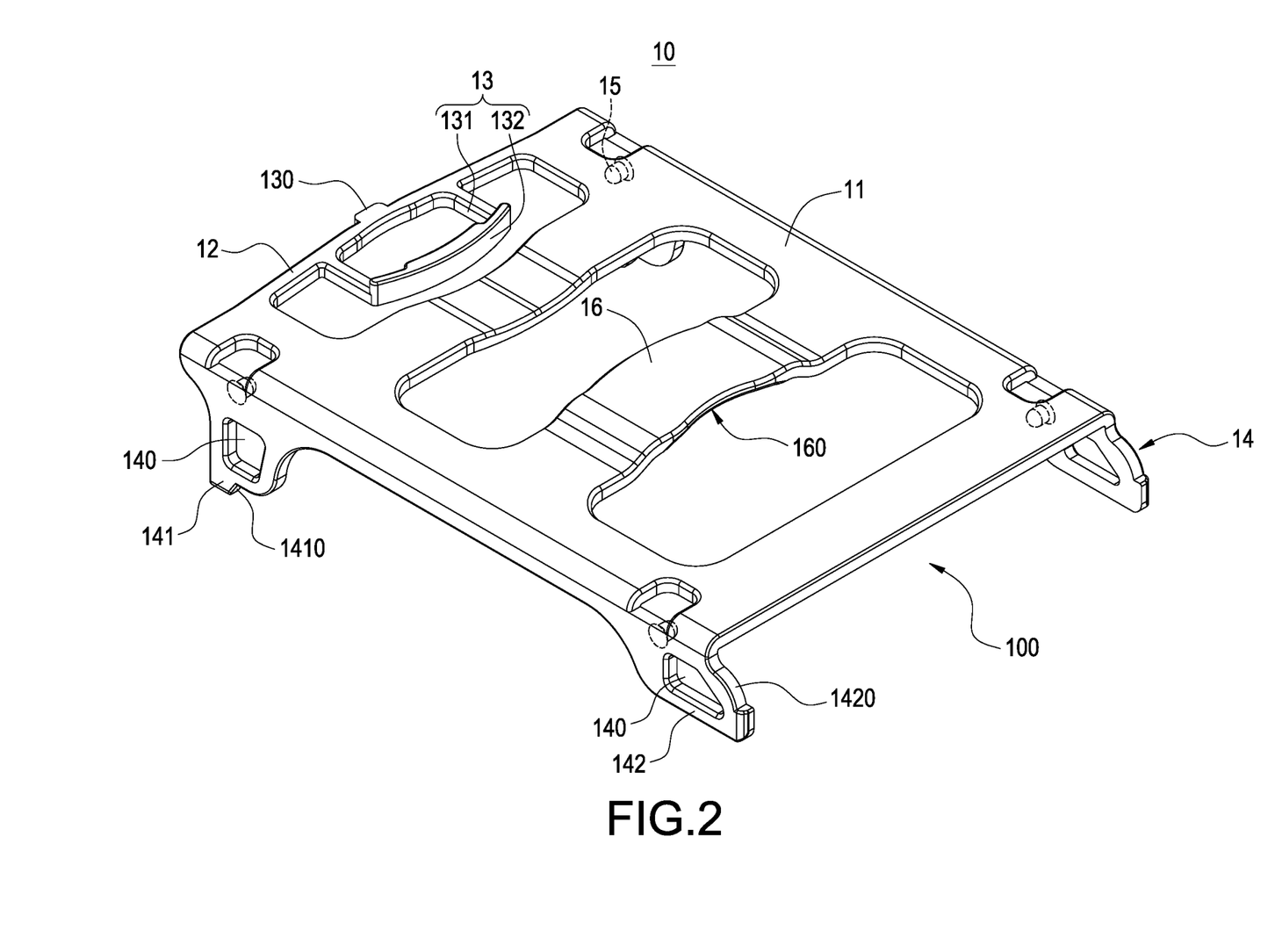
FIG. 2 is a perspective schematic view of carrier case of the present invention.

Please refer to FIG. 1 and FIG. 2, which depict a perspective assembly schematic view of accommodating structure of data storage unit of the present invention and a perspective schematic view of carrier case of the present invention. The accommodating structure of data storage unit for combining a data storage unit 2 of the present invention comprising a carrier case 10 formed by integrated injection molding. Besides, the carrier case 1 is a plastic piece comprising a housing 11, a pair of elastic arms 12 connected with the housing 11 and a push block 13 located between the pair of elastic arms 12. The housing 11 is formed with a receiving space 100 for accommodating the data storage unit 2, and the push block 13 has a tab 130 at a side away from the receiving space 100. More detailed descriptions of the structure of the carrier case 10 are as follows.

In one embodiment of the present invention, the carrier case 10 further includes a plurality of pins 14 extended from the housing 11, and the pins 14 includes a plurality of front pins 141 and a plurality of rear pins 142. It is worth noting that the pins 14 are formed with a hollow portion 140 separately. The hollow portion 140 is provided to avoid of blocking airflow, and that allows the airflow to enter the carrier case 10 for facilitating heat dissipation of the data storage unit 2, and it also can save materials and enhance aesthetics. Besides, each of the front pins 141 has a front chamfer 1410 at an outer peripheral thereof, and each of the rear pins 142 has a rear chamfer 1420 at an outer peripheral thereof to avoid structural interference between the rear pins 142 and other structures.

In addition, the carrier case 10 is formed with a plurality of positioning pins 15 on walls facing the receiving space 100 for positioning the data storage unit 2; on the other hand, the periphery of the data storage unit 2 is formed with a plurality of combining holes 3. Thereby, the carrier case 10 and the data storage unit 2 are combined together through the positioning pins 15 and the combining holes 3 without using screws.

Moreover, the carrier case 10 further includes a grip portion 16 connected with the housing 11. The grip portion 16 is protruded away from the receiving space 100, and a holding space 160 is formed between the grip portion 16 and the data storage unit 2 in the receiving space 100, thus a user can hold the carrier case 10 which has combined the data storage unit 2 easier.

Preferably, one end of each elastic arm 12 is extended obliquely from the housing 11 and the other end is connected with the push block 13. In particular, the push block 13 includes an extension segment 131 connected with the pair of elastic arms 12 and a finger pushing segment 132 vertically connected with the extension segment 131. Accordingly, a user can use the thumb to push the finger pushing section 132 and the pair of elastic arms 12 which are connected thereto, thereby the tab 130 will be disengaged from its positioning.

Figure 3:
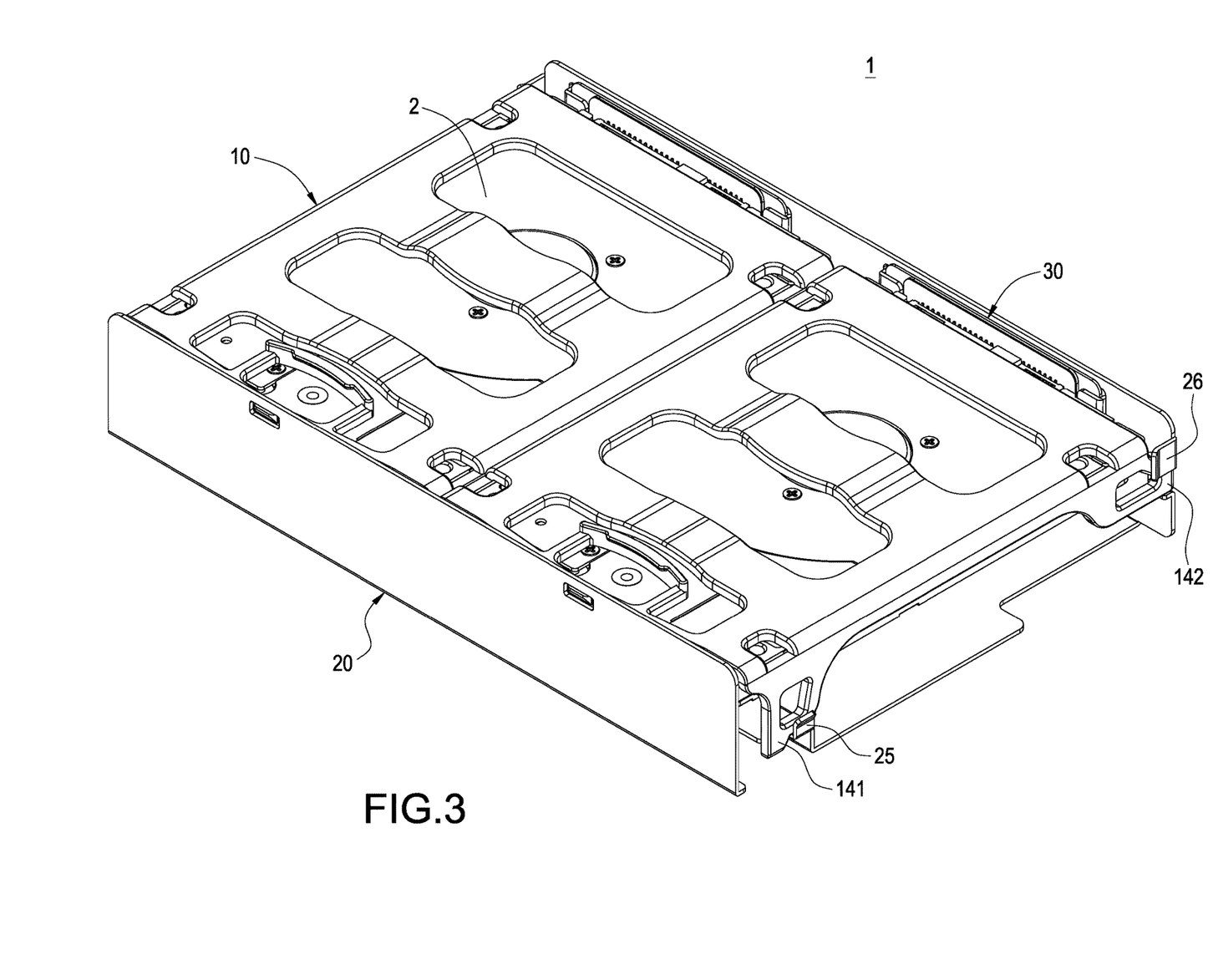
FIG. 3 and FIG. 4 are two perspective schematic views from two sides of accommodating assembly of data storage unit of the present invention.
Figure 4:
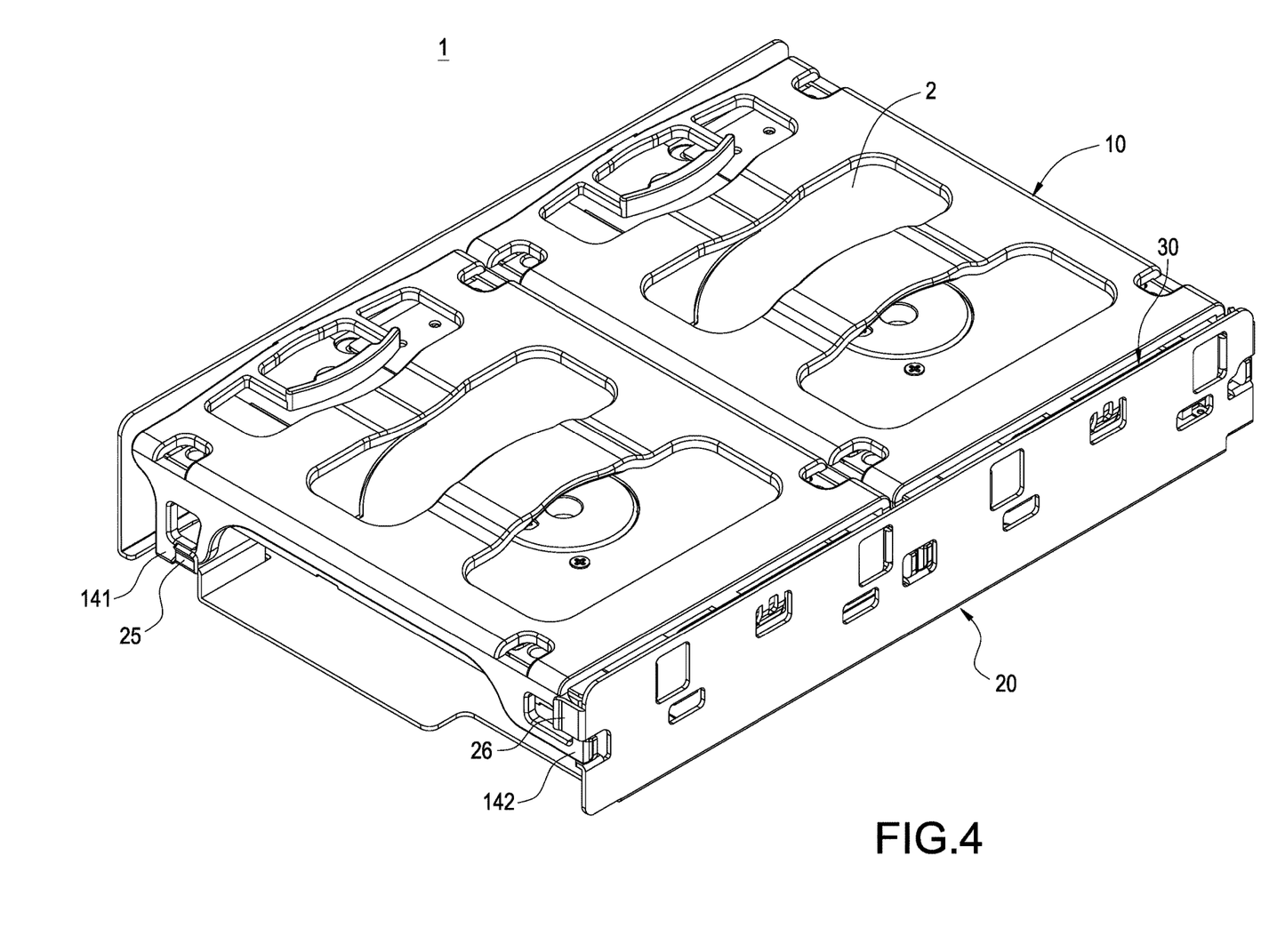

Please further refer to FIG. 3 and FIG. 4, they depict two perspective schematic views of accommodating assembly of data storage unit of the present invention. As shown in figures, the accommodating assembly 1 of data storage unit for combining at least one data storage unit 2 includes at least one carrier case 10 as described above, a tray 20 and a circuit board module 30. The tray 20 is disposed with the circuit board module 30. The carrier case 10 has accommodated with the data storage unit 2 and combined in the tray 20 for electrically connected with the circuit board module 30.

It is worth noticing that the tray 20 of the present invention has a plurality of front stoppings 25 and a plurality of rear stoppings 26. When the carrier case 10 is assembled into the tray 20, the front pins 141 of the carrier case 10 are blocked by the front stoppings 25 without moving back and forth, and the rear pins 142 of the carrier case 10 are blocked by the rear stoppings 26 without moving left and right. Thereby, the carrier case 10 can be coupled in the tray 20 firmly.

Figure 5:
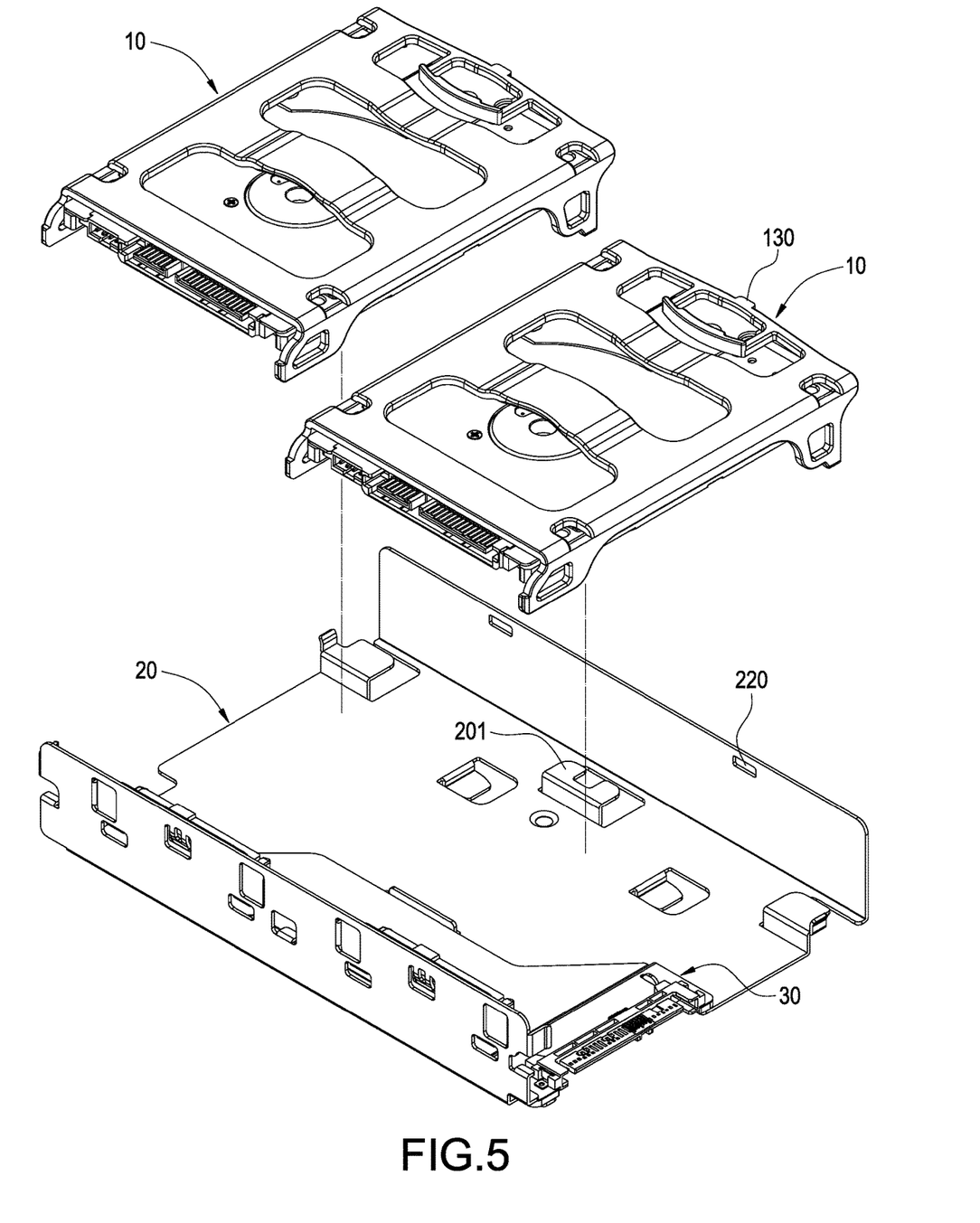
FIG. 5 and FIG. 6 are two perspective assembly schematic views of circuit board module and accommodating assembly of the present invention.
Figure 6:
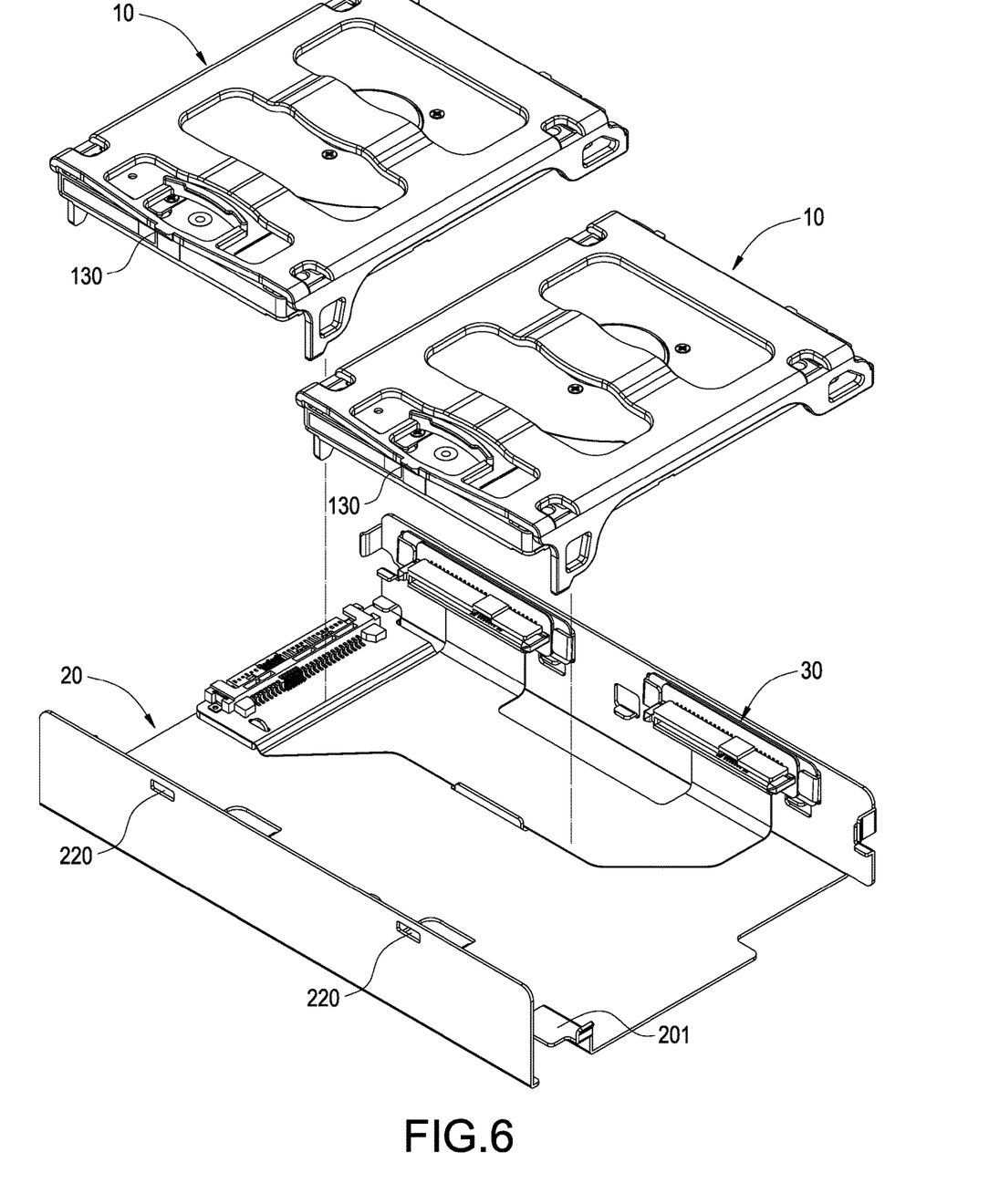

With referring to FIG. 5 and FIG. 6, which depict two perspective assembly schematic views of circuit board module and accommodating assembly of the present invention. As shown in the figures, the tray 20 is formed with a plurality of supporting pads 201, and the carrier case 10 is disposed on the supporting pads 201. Besides, the tray 20 has a plurality of positioning slots 220, and the carrier case 10 is fixed on the tray 20 through the tab 130 being latched by the positioning slot 220.

It should be noted that, the carrier case 10 is detachably disposed in the tray 20; besides, the structure of the carrier case 10 is described as above and will not describe again herein.

Figure 7:
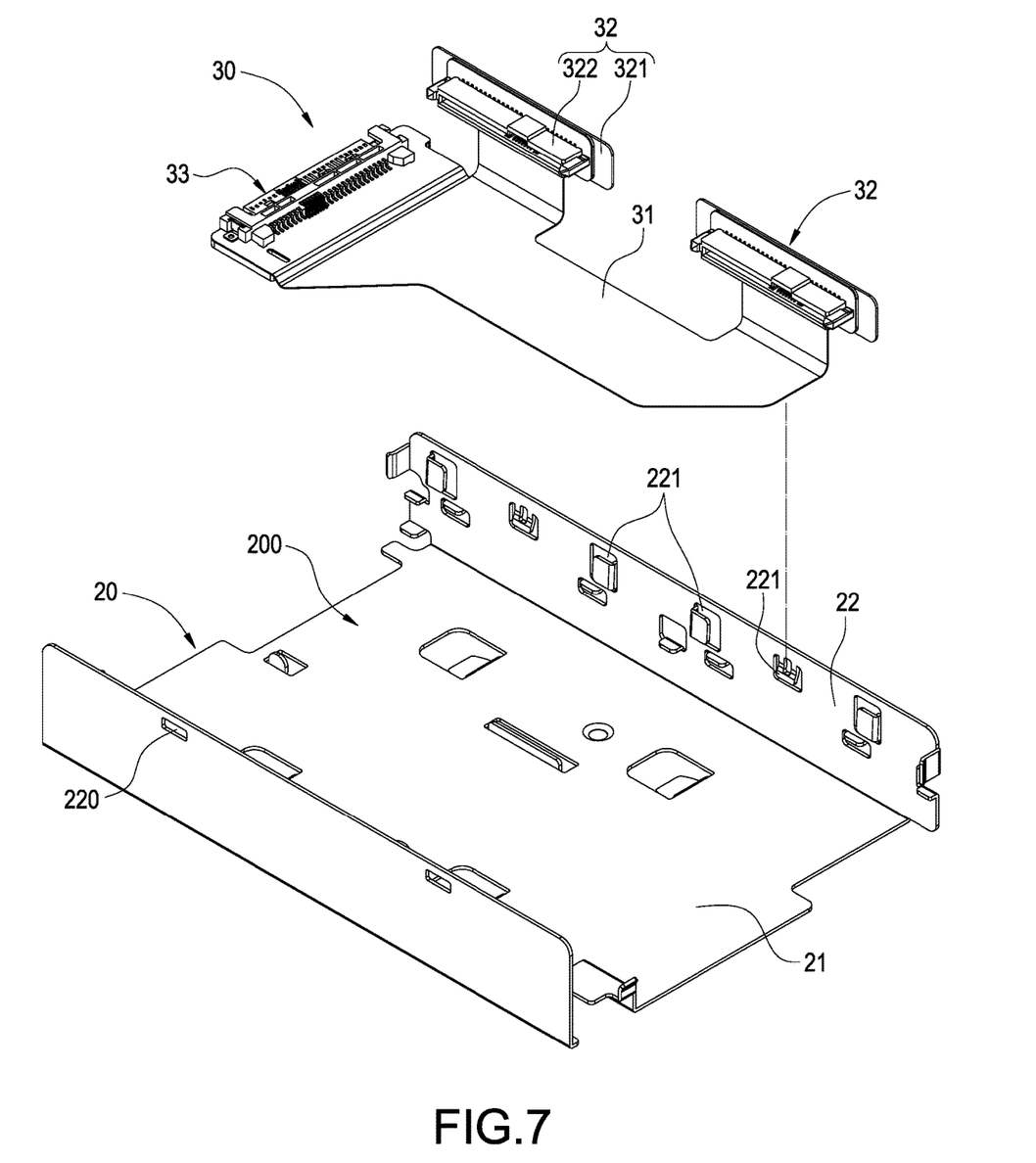
FIG. 7 and FIG. 8 are perspective assembly schematic views of tray and circuit board module of the present invention.
Figure 8:
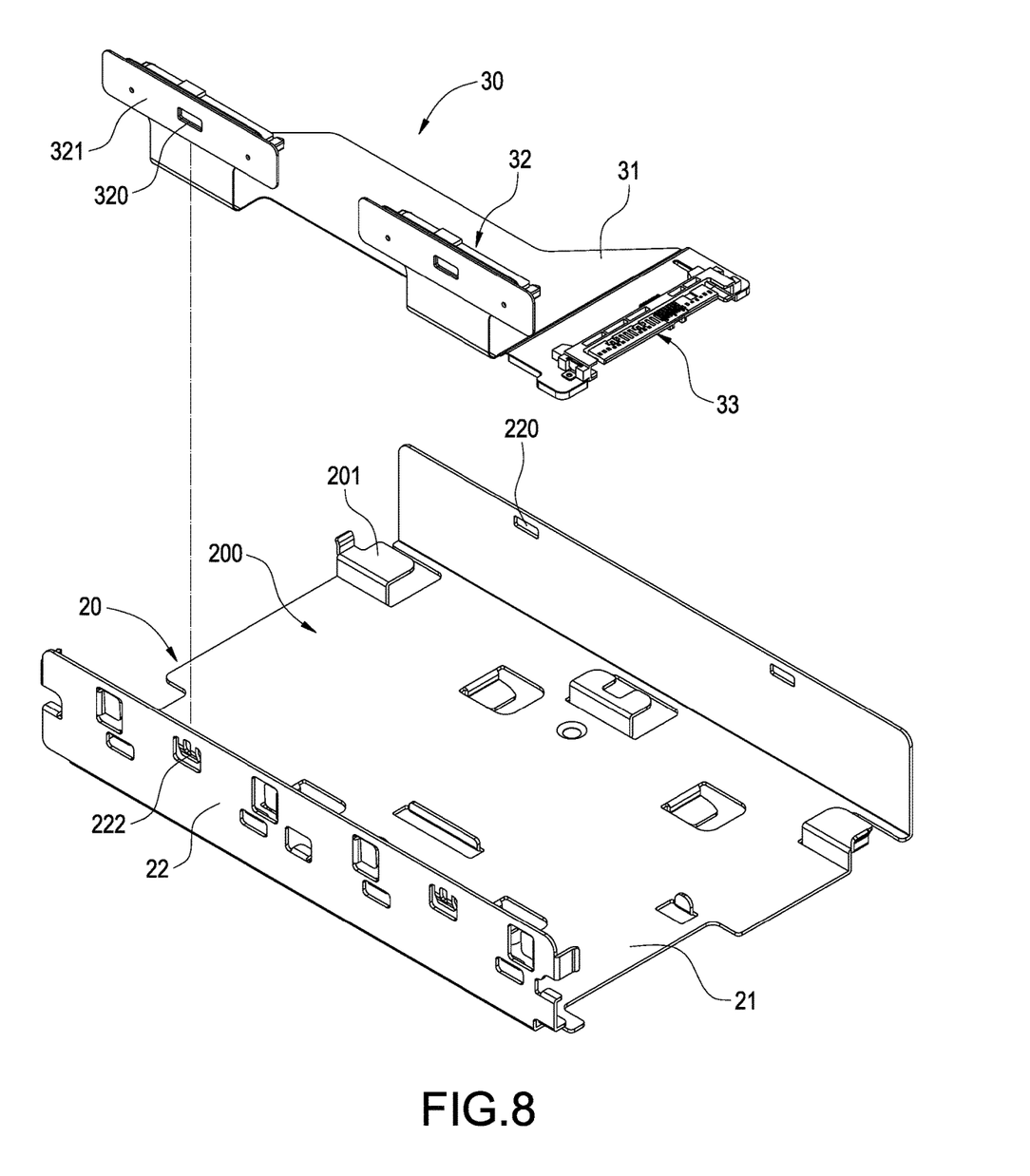

Please also refer FIG. 7 and FIG. 8, they depict perspective assembly schematic view of tray and circuit board module of the present invention. As shown in FIG. 7, the tray 20 includes a bottom plate 21 and a plurality of supporting plates 22 vertically extended from the bottom plate 21. The bottom plate 21 and the supporting plates 22 are enclosed to form a carrying space 200, and the supporting plates 22 are provided with a plurality of positioning slots 220.

Furthermore, the circuit board module 30 is disposed in the carrying space 200. The circuit board module 30 includes a circuit board 31, a pair of adapter slots 32 and an insertion slot 33 electrically connected with the circuit board 31. Besides, each adapter slot 32 includes an adapter plate 321 and an adapter connector 322 combined on the adapter plat 321. Preferably, the circuit board 31 is a flexible printed circuit (FPC), and the pair of the adapter slots 32 are spaced and juxtaposed on one side of the tray 20.

In the present embodiment, the supporting plate 22 of the tray 20 has a plurality of notches 221, and the adapter plate 321 of the adapter slot 32 is inserted in the notches 221 for combining with the tray 20.

As shown in FIG. 8, in an embodiment of the present invention, the supporting plate 22 has a plurality of hooks 222, besides, the adapter plate 321 of the adapter slot 32 is provided with a trough 320. Thereby, the adapter plate 321 is positioned on the supporting plate 22 by the trough 320 and the hook 222 snapped together.

Figure 9:
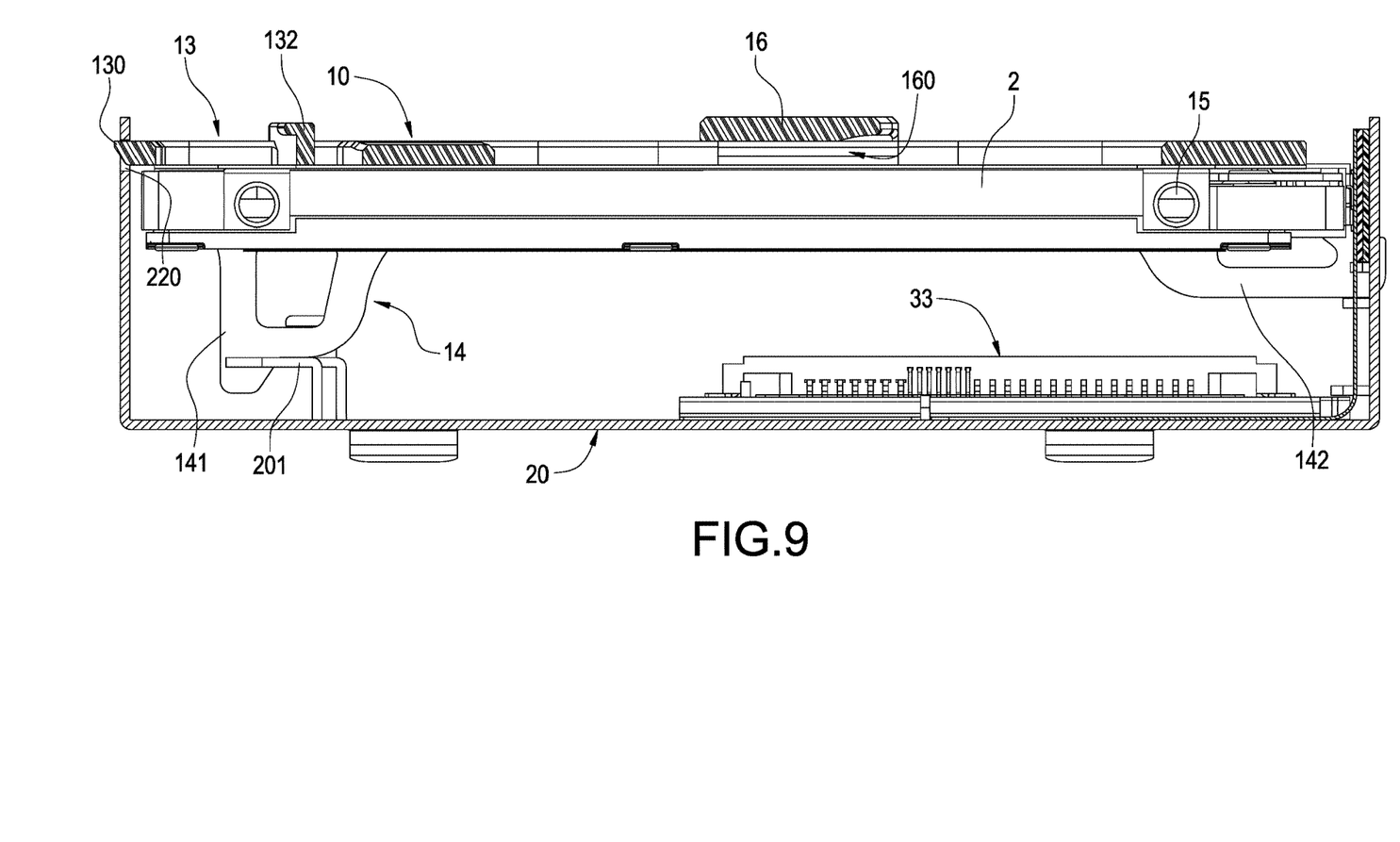
FIG. 9 and FIG. 10 are cross sectional views of accommodating assembly of data storage unit of the present invention.
Figure 10:
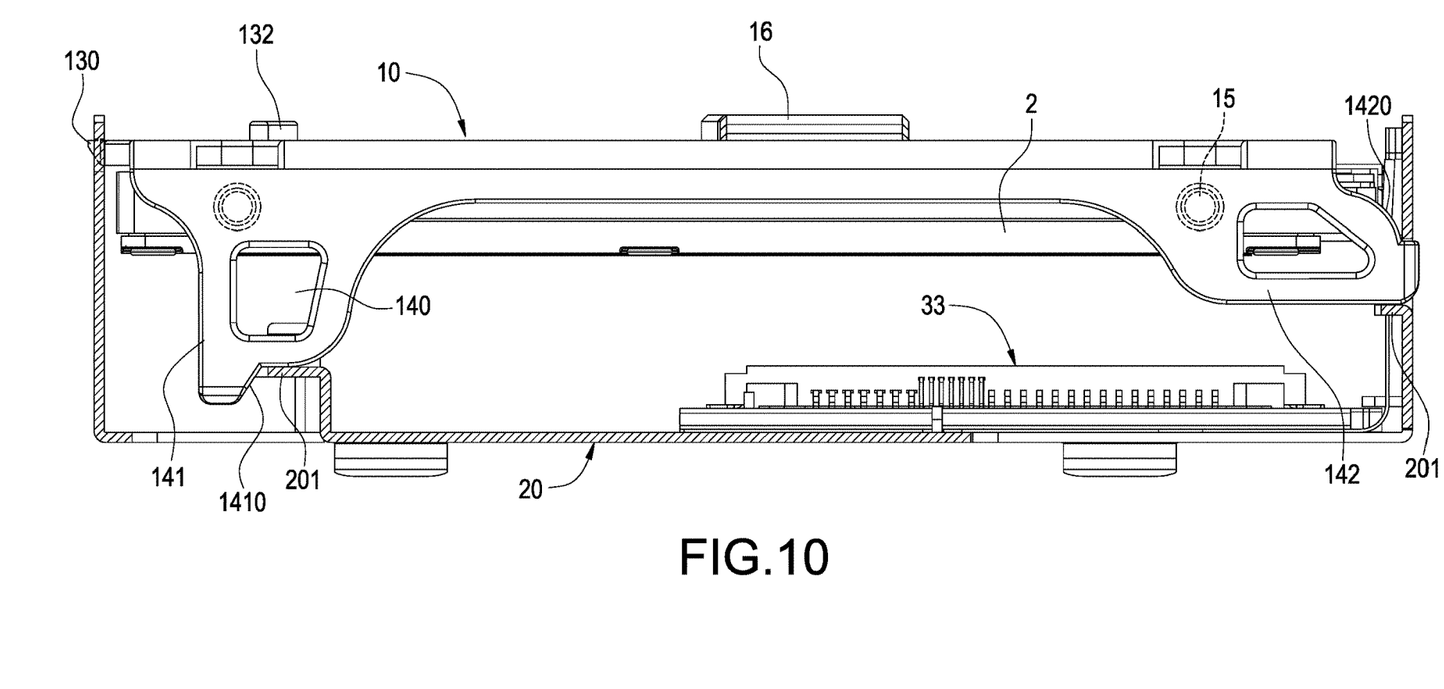

Please also refer to FIG. 9 and FIG. 10, which depict cross sectional views of accommodating assembly of data storage unit of the present invention. It is obviously from FIG. 9, the carrier case 10 is fixed on the tray 220 through the tab 130 being latched by the positioning slot 220. In addition, as shown in FIG. 10, the front pins 141 and the rear pins 142 of the carrier base 10 are placed on the supporting pads 201 of the tray 20.

It is worth noting that, during the assembly process, the front chamber 1410 of the front pins 141 has a guiding effect when press the carrier case 10 into the receiving space 200; moreover, the rear chamfer 1420 of rear pins 142 is arranged to avoid structural interference with the tray 20 during the processes of assembly or detachment.

Figure 11:
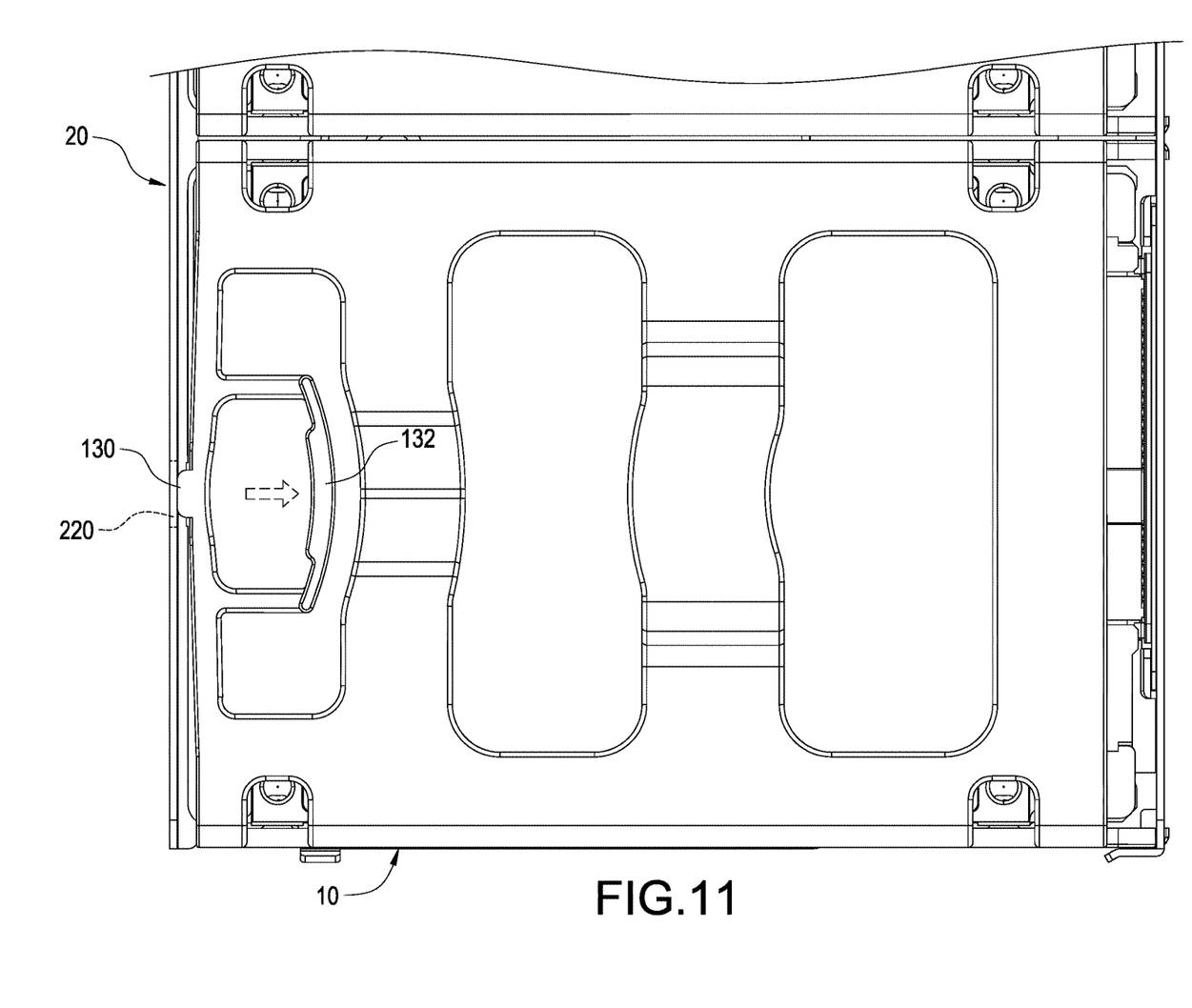
FIG. 11 is a schematic view of push block under an external force of the present invention.
Figure 12:
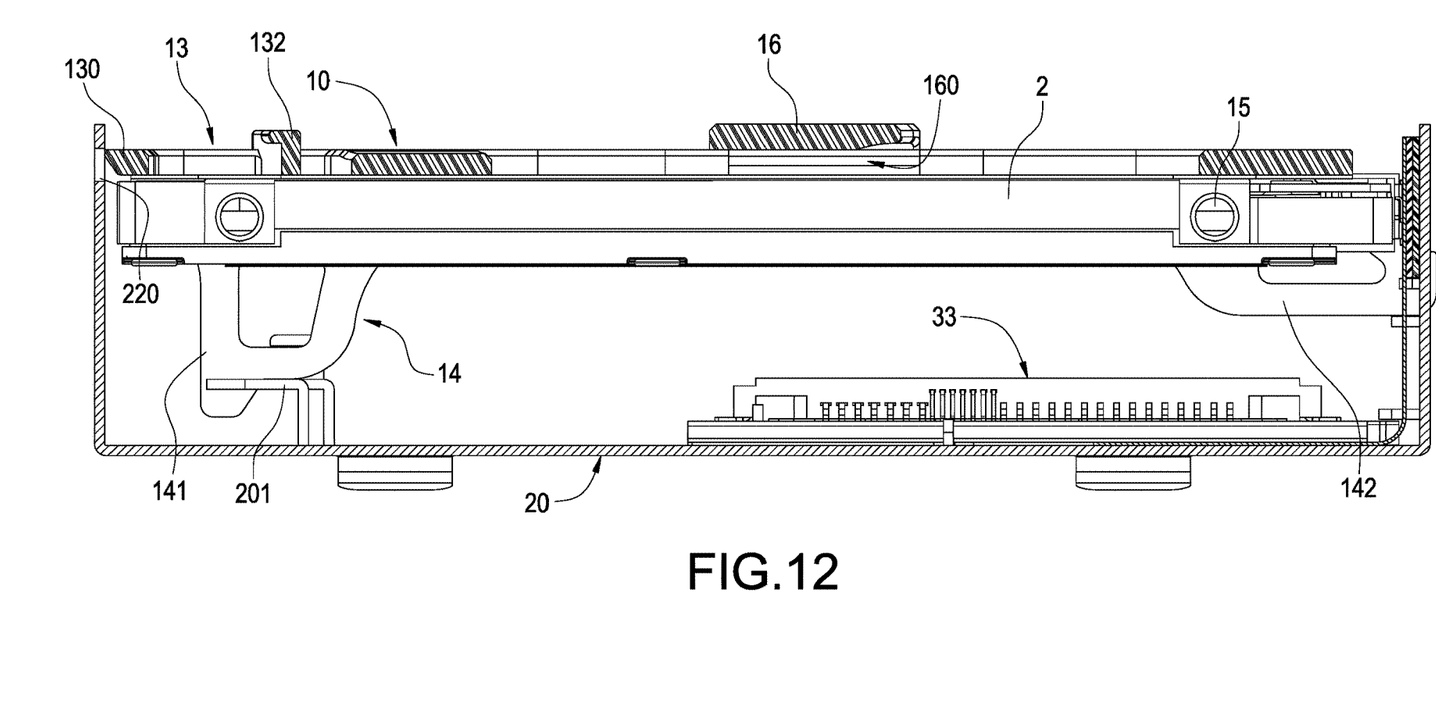
FIG. 12 is a cross sectional schematic view of tab disengaged from its positioning of the present invention.

Please also refer to FIG. 11 and FIG. 12, which depict a schematic view of push block under an external force of the present invention and a cross sectional schematic view of the tab of the push block disengaged from its position of the present invention. Please refer to FIG. 11, when a user wants the carrier case 10 which has combined the data storage unit 2 to be taken out of the tray 20, then an outer force will be applied on the finger pushing section 132 of the push block 13. Under this force, the pair of elastic arms 12 are moved along with the finger pushing section 132. At this time, as shown in FIG. 12, the tab 130 located between the pair of elastic arms 12 will be moved toward the push block 13 with the deformed elastic arms 12, thereby the tab 130 will be moved out of the positioning slot 220 of the tray 20 to be disengaged from its positioning.

Figure 13:
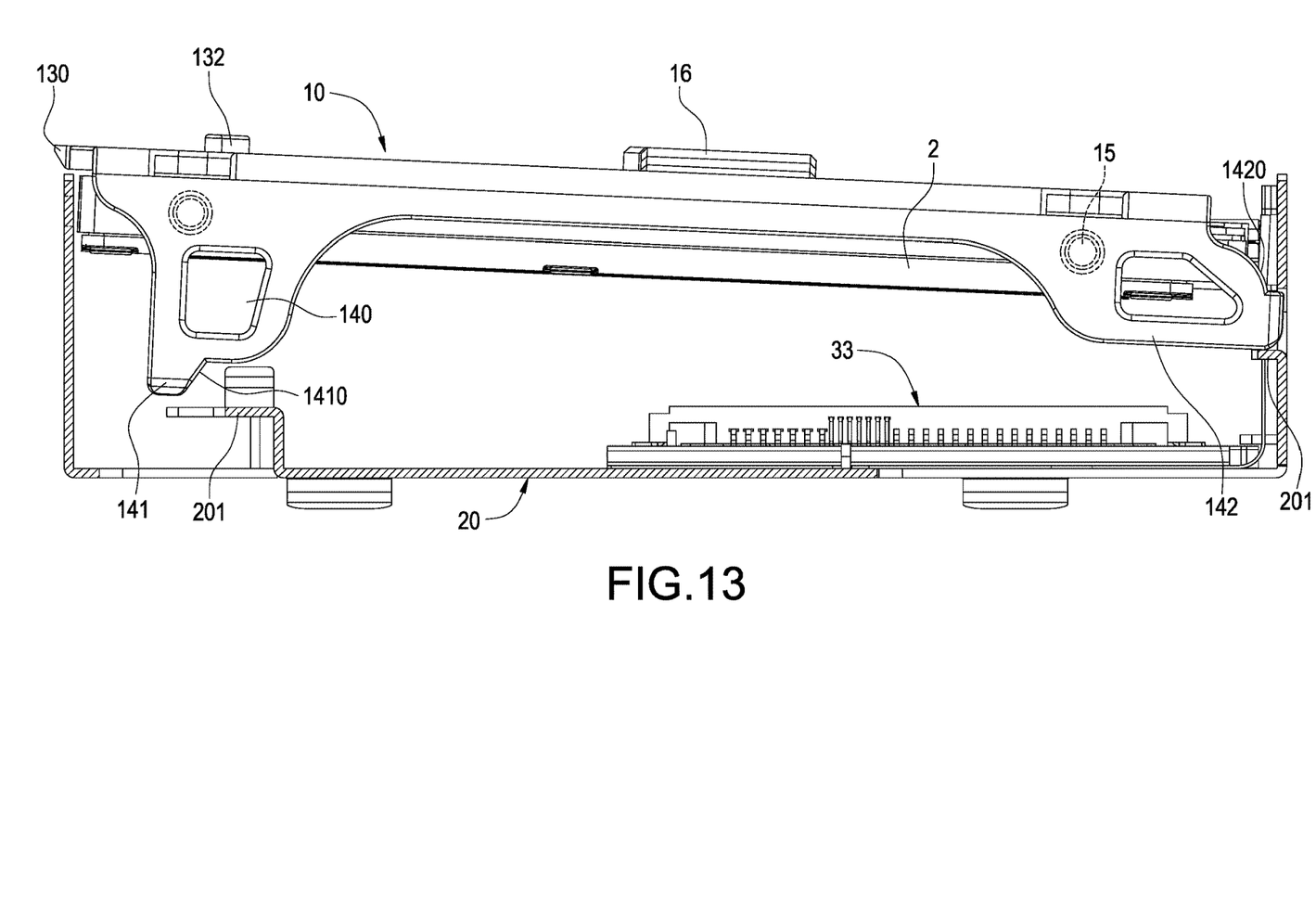
FIG. 13 is a schematic view of carrier case detached from the tray of the present invention.

Please refer to FIG. 13, it depicts a schematic view of carrier case detached from the tray of the present invention. After the tab 130 of the carrier case 10 is disengaged from its position, the user's hand can hold the finger pushing portion 132 and the grip portion 16 to rotate the carrier case 10. Therefore, the carrier base 10 is rotated by the rear pins 142 as pivots, thus the carrier case 10 can be detached from the tray 20 and removed.

Figure 14:
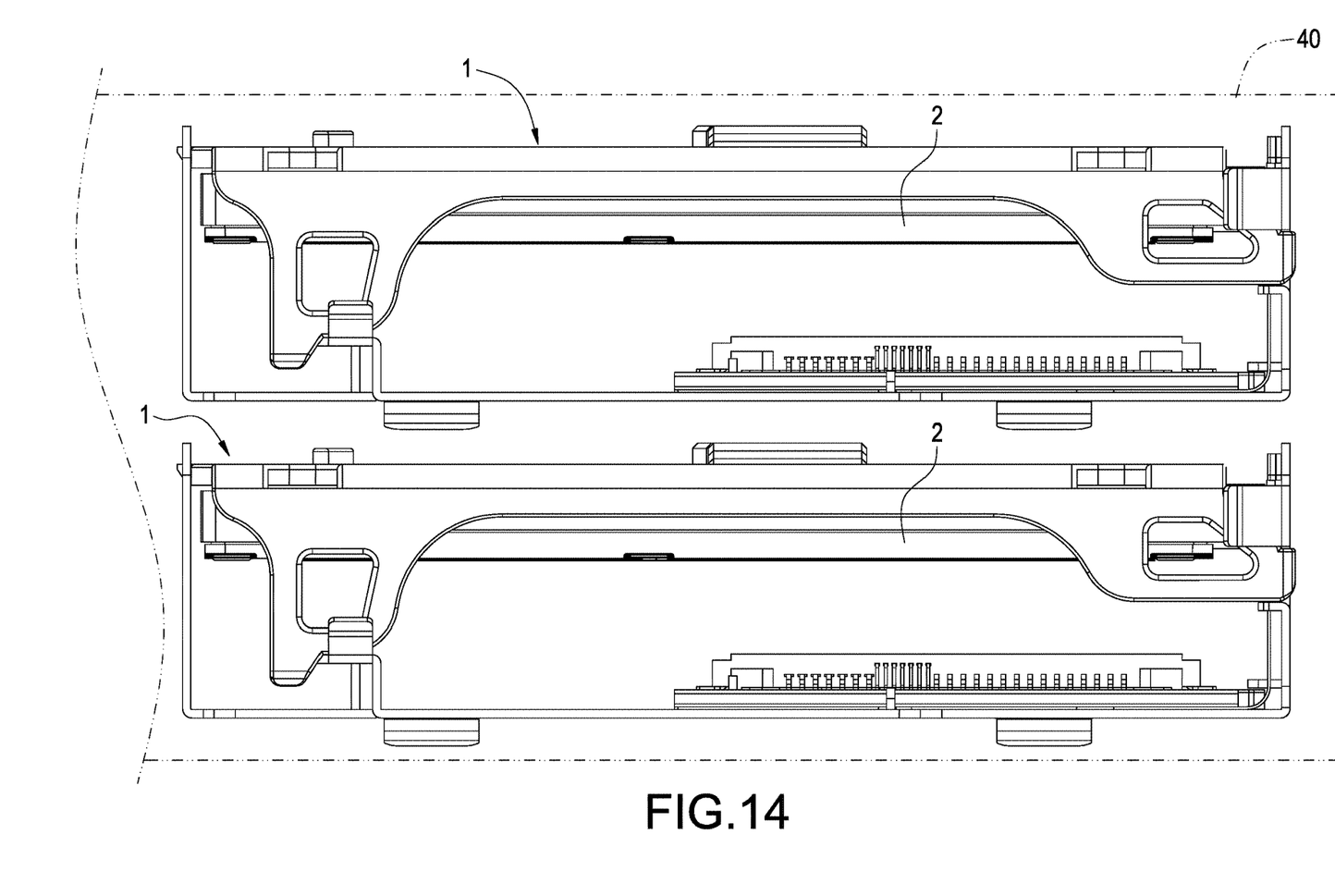
FIG. 14 is a schematic view of accommodating assembly of data storage unit when it is combined in the cabinet of the present invention.

With referring to FIG. 14, it depicts a schematic view of accommodating assembly of data storage unit when it is combined in the cabinet of the present invention. The accommodating assembly 1 of the present invention further includes a cabinet 40. The accommodating assembly 1 which combined with at least one data storage unit 2 is installed in the cabinet 40 to constitute the accommodating assembly 1 of data storage unit 2 as a server. It should be noted that, the cabinet 40 can be combined with a plurality of accommodating assemblies 1, and the accommodating assemblies 1 can be arranged in an array in the cabinet 40 by stacking.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. An accommodating structure of data storage unit for combining a data storage unit, comprising a carrier case formed by integrated injection molding; the carrier case being a plastic piece and comprising a housing, a pair of elastic arms connected with the housing and a push block located between the pair of elastic arms; the housing formed with a receiving space for accommodating the data storage unit, and the push block having a tab at a side away from the receiving space; wherein one end of each elastic arm is extended obliquely from the housing and the other end is connected with the push block, such that the push block is able to pull and deform each elastic arm by being pushed by an external force to further move the tab in a direction toward the data storage unit and disengage the tab from a positioning slot.

2. The accommodating structure of data storage unit according to claim 1, wherein the carrier case further includes a plurality of pins extending from the housing, and the pins includes a plurality of front pins and a plurality of rear pins; each of the front pins has a front chamfer at an outer peripheral thereof, and each of the rear pins has a rear chamfer at an outer peripheral thereof.

3. The accommodating structure of data storage unit according to claim 2, wherein the carrier case is formed with a plurality of positioning pins on walls facing the receiving space for positioning the data storage unit.

4. The accommodating structure of data storage unit according to claim 1, wherein the carrier case further includes a grip portion connected with the housing; the grip portion is protruded away from the receiving space, and a holding space is formed between the grip portion and the data storage unit in the receiving space.

5. The accommodating structure of data storage unit according to claim 1, wherein the push block includes an extension segment connected with the pair of elastic arms and a finger pushing segment vertically connected with the extension segment.

6. An accommodating assembly of data storage unit for combining at least one data storage unit, comprising: a tray including a bottom plate and a plurality of supporting plates vertically extended from the bottom plate; the bottom plate and the supporting plates being enclosed to form a carrying space, and the supporting plates having a plurality of positioning slots; a circuit board module disposed in the carrying space; the circuit board module including a circuit board, a pair of adapter slots and an insertion slot electrically connected with the circuit board; and at least one carrier case removably disposed in the carrying space; the carrier case being a plastic piece and comprising a housing, a pair of elastic arms connected with the housing and a push block located between the pair of elastic arms; the housing formed with a receiving space for accommodating the at least one data storage unit, and the push block having a tab at a side away from the receiving space; the carrier case fixed on the tray through the tab being latched by the positioning slots, wherein one end of each elastic arm is extended obliquely from the housing and the other end is connected with the push block, the pair of elastic arms will be pulled to deform by the push block under an external force, so that the tab will be moved in a direction toward the associated data storage unit and disengaged from the positioning slots, thus the carrier case can be detached from the tray.

7. The accommodating assembly of data storage unit according to claim 6, wherein the carrier case further includes a plurality of pins extended from the housing, and the pins includes a plurality of front pins and a plurality of rear pins; each of the front pins has a front chamfer at an outer peripheral thereof, and each of the rear pins has a rear chamfer at an outer peripheral thereof.

8. The accommodating assembly of data storage unit according to claim 7, wherein the carrier case is formed with a plurality of positioning pins on walls facing the receiving space for positioning the data storage unit.

9. The accommodating assembly of data storage unit according to claim 7, wherein the tray has a plurality of front stoppings and a plurality of rear stoppings; the front pins of the carrier case are blocked by the front stoppings without moving back and forth, and the rear pins of the carrier case are blocked by the rear stoppings without moving left and right.

10. The accommodating assembly of data storage unit according to claim 6, wherein the carrier case further includes a grip portion connected with the housing; the grip portion is protruded away from the receiving space, and a holding space is formed between the grip portion and the data storage unit in the receiving space.

11. The accommodating assembly of data storage unit according to claim 6, wherein the push block includes an extension segment connected with the pair of elastic arms and a finger pushing segment vertically connected with the extension segment.

12. The accommodating assembly of data storage unit according to claim 6, wherein the tray is formed with a plurality of supporting pads, and the data storage unit is fixed on the supporting pads through the plurality of front pins and the plurality of rear pins.

13. The accommodating assembly of data storage unit according to claim 6, wherein each of the adapter slots includes an adapter plate and an adapter connector combined on the adapter plate; the supporting plate has a plurality of notches, and the adapter plate is inserted in the notches.

14. The accommodating assembly of data storage unit according to claim 13, wherein the supporting plate has a plurality of hooks, and the adapter plate is provided with a trough; the adapter plate is positioned on the supporting plate by the trough and the hook snapped together.

15. The accommodating assembly of data storage unit according to claim 13, wherein the pair of the adapter slots are spaced and juxtaposed on one side of the tray.

16. An accommodating assembly of data storage unit mounted on server for combining at least one data storage unit, comprising an accommodating assembly of data storage unit of claim 6 and a cabinet, wherein the accommodating assembly is combined in the cabinet.

* * * * *